United States Patent
Davidson et al.

(10) Patent No.: US 9,692,226 B2
(45) Date of Patent: Jun. 27, 2017

(54) CIRCUIT INTERRUPTION DEVICE

(71) Applicant: ALSTOM Technology Ltd, Baden (CH)

(72) Inventors: Colin Charnock Davidson, Stafford (GB); Jean-Pierre Dupraz, Bressolles (FR)

(73) Assignee: General Electric Technology GmbH, Baden (CH)

( * ) Notice: Subject to any disclaimer, the term of this patent is extended or adjusted under 35 U.S.C. 154(b) by 150 days.

(21) Appl. No.: 14/423,050

(22) PCT Filed: Aug. 23, 2013

(86) PCT No.: PCT/EP2013/067584
§ 371 (c)(1),
(2) Date: Feb. 20, 2015

(87) PCT Pub. No.: WO2014/029886
PCT Pub. Date: Feb. 27, 2014

(65) Prior Publication Data
US 2015/0236498 A1    Aug. 20, 2015

(30) Foreign Application Priority Data

Aug. 23, 2012  (EP) .................................... 12275122

(51) Int. Cl.
H02H 1/04      (2006.01)
H02H 3/087     (2006.01)
H02H 7/12      (2006.01)

(52) U.S. Cl.
CPC .............. H02H 3/087 (2013.01); H02H 7/12 (2013.01)

(58) Field of Classification Search
CPC   H02H 1/04; H02H 9/008; H02H 9/03; H02H 9/04; H02H 9/043

(Continued)

(56) References Cited

U.S. PATENT DOCUMENTS 3,611,031 A * 10/1971 Lutz .................... H02H 3/021
                                                        218/143
3,947,726 A    3/1976 DeCecco et al.
(Continued)

FOREIGN PATENT DOCUMENTS

EP        0 867 998 B1      9/1998
EP        2 669 921 A1     12/2013
(Continued)

OTHER PUBLICATIONS

Hafner, J. et al., "Proactive Hybrid HVDC Breakers—A key innovation for reliable HVDC grids," CIGRE Symposium, Bologna, Italy (Sep. 2011).

(Continued)

*Primary Examiner* — Scott Bauer
(74) *Attorney, Agent, or Firm* — Foley & Lardner LLP

(57) ABSTRACT

An extinguishing branch (28) for an electrical circuit (32) includes: a snubber circuit (36) including an energy storage limb (40), wherein the energy storage limb (40) includes first and second energy storage limb portions separated by a first junction (46) to define a first voltage divider, and each energy storage limb portion includes at least one energy storage device (48,50); and an arrester limb (38) connected across the energy storage limb (40), wherein the arrester limb (38) includes first and second arrester limb portions separated by a second junction (52) to define a second voltage divider, and each arrester limb portion includes at least one arrester element (54,56), wherein the first and second junctions (46,52) are connected to define a voltage divider bridge, and the voltage divider bridge is electrically coupleable to the electrical circuit (32) so as to provide, in use, a driving voltage to drive the electrical circuit (32).

13 Claims, 5 Drawing Sheets

(58) Field of Classification Search
USPC .......................................................... 361/57
See application file for complete search history.

(56) References Cited

U.S. PATENT DOCUMENTS

| | | | | |
|---|---|---|---|---|
| 4,198,668 | A | * | 4/1980 | Bergdahl ............. H01H 33/596 361/13 |
| 4,232,235 | A | | 11/1980 | Faust et al. |
| 4,300,181 | A | * | 11/1981 | Premerlani ............ H02H 7/222 361/13 |
| 5,517,378 | A | * | 5/1996 | Asplund .............. H01H 33/596 361/3 |
| 6,438,002 | B2 | | 8/2002 | Alhoussami |
| 6,751,077 | B2 | * | 6/2004 | Gossner ............. H01L 27/0266 361/56 |
| 7,411,797 | B2 | * | 8/2008 | Norrga ................ H02M 7/4826 363/17 |
| 2004/0218318 | A1 | * | 11/2004 | Bijlenga ................ H02M 7/48 361/8 |
| 2009/0322304 | A1 | * | 12/2009 | Oraw ...................... H02J 1/102 323/312 |
| 2012/0007657 | A1 | | 1/2012 | Naumann et al. |

FOREIGN PATENT DOCUMENTS

| | | |
|---|---|---|
| EP | 2 701 255 A | 2/2014 |
| FR | 1357974 | 4/1964 |
| FR | 1357975 | 4/1964 |
| JP | 06-153491 A | 5/1994 |
| JP | 08-195664 A | 7/1996 |
| JP | 2002-152024 A | 5/2002 |
| WO | WO-2011/057675 A1 | 5/2011 |
| WO | WO-2011/095212 A2 | 8/2011 |
| WO | WO-2012/100831 A1 | 8/2012 |
| WO | WO-2012/103936 A1 | 8/2012 |
| WO | WO-2012/104371 A1 | 8/2012 |
| WO | WO-2012/104377 A1 | 8/2012 |
| WO | WO-2012/123015 A1 | 9/2012 |
| WO | WO-2013/092873 A1 | 6/2013 |
| WO | WO-2013/092878 A1 | 6/2013 |
| WO | WO-2013/127462 A1 | 9/2013 |
| WO | WO-2013/127463 A1 | 9/2013 |
| WO | WO-2013/178696 A1 | 12/2013 |
| WO | WO-2014/029542 A1 | 2/2014 |

OTHER PUBLICATIONS

English-language machine translation of FR 1357975, Machf Werklust (Apr. 10, 1964).
English-language machine translation of JP2002152024, Mitsubishi Electric Corp. (May 24, 2002).
English-language machine translation of JP H06-153491, Fuji Electric Co. Ltd. (May 31, 1994).
English-language machine translation of JP H08-195664, Fuji Electric Co. Ltd. (Jul. 30, 1996).
English-language machine translation of FR 1357974, Consortium Fuer Elektrochemische Industrie GMBH (Apr. 10, 1964).
English-language machine translation of WO 2013/092878, Alstom Technology Ltd. (Jun. 27, 2013).
English-language machine translation of WO 2013/092873, Alstom Technology Ltd. (Jun. 27, 2013).
English-language machine translation of WO 2012/104377, Alstom Technology Ltd. (Aug. 9, 2012).
English-language machine translation of WO 2012/104371, Alstom Technology Ltd. (Aug. 9, 2012).
English-language machine translation of WO 2012/103936, Siemens AG (Aug. 9, 2012).
International Search Report and Written Opinion for PCT Application No. PCT/EP2013/067584, mailed Mar. 17, 2014, 9 pages.

* cited by examiner

CIRCUIT INTERRUPTION DEVICE

CROSS REFERENCE TO RELATED APPLICATIONS

The present application is a National Stage of International Application No. PCT/EP2013/067584, filed Aug. 23, 2013, which claims priority to European Application No. 12275122.5, filed Aug. 23, 2012, which is incorporated herein by reference in its entirety.

This invention relates to a switching element, a circuit interruption device and an extinguishing branch, for use in high voltage direct current (HVDC) power transmission.

In power transmission networks alternating current (AC) power is typically converted to direct current (DC) power for transmission via overhead lines and/or undersea cables. This conversion removes the need to compensate for the AC capacitive load effects imposed by the transmission line or cable, and thereby reduces the cost per kilometer of the lines and/or cables. Conversion from AC to DC thus becomes cost-effective when power needs to be transmitted over a long distance.

The conversion of AC to DC power is also utilized in power transmission networks where it is necessary to interconnect AC networks operating at different frequencies. In any such power transmission network, converters are required at each interface between AC and DC power to effect the required conversion.

HVDC converters are vulnerable to DC side faults or other abnormal operating conditions that can present a short circuit with low impedance across the DC power transmission lines or cables. Such faults can occur due to damage or breakdown of insulation, lightning strikes, movement of conductors or other accidental bridging between conductors by a foreign object.

The presence of low impedance across the DC power transmission lines or cables can be detrimental to a HVDC converter. Sometimes the inherent design of the converter means that it cannot limit current under such conditions, resulting in the development of a high fault current exceeding the current rating of the HVDC converter. Such a high fault current not only damages components of the HVDC converter, but also results in the HVDC converter being offline for a period of time. This results in increased cost of repair and maintenance of damaged electrical apparatus hardware, and inconvenience to end users relying on the working of the electrical apparatus. It is therefore important to be able to interrupt the high fault current as soon as it is detected.

A conventional means of protecting a HVDC converter from DC side faults, in cases where the converter control cannot limit the fault current by any other means, is to trip an AC side circuit breaker, thus removing the supply of current that feeds the fault through the HVDC converter to the DC side. This is because there are currently no commercially available HVDC circuit breaker designs. Furthermore, almost all HVDC schemes are currently point-to-point schemes with two HVDC converters connected to the DC side, whereby one HVDC converter acts as a power source with power rectification capability and the other HVDC converter acts as a power load with power inversion capability. Hence, tripping the AC side circuit breaker is acceptable because the presence of a fault in the point-to-point scheme requires interruption of power flow to allow the fault to be cleared.

A new class of HVDC power transmission networks are being considered for moving large quantities of power over long distances, as required by geographically dispersed renewable forms of generation, and to augment existing capabilities of AC power transmission networks with smart-grid intelligence and features that are able to support modern electricity trading requirements.

Such a HVDC power transmission network requires multi-terminal interconnection of HVDC converters, whereby power can be exchanged on the DC side using three or more HVDC converters operating in parallel. Each HVDC converter acts as either a source or sink to maintain the overall input-to-output power balance of the network whilst exchanging the power as required. Faults in the HVDC power transmission network need to be quickly isolated and segregated from the rest of the network in order to enable the network to resume normal power transmission as soon as possible.

Current interruption in conventional AC circuit breakers is carried out when the current reaches a current zero, so as to considerably reduce the difficulty of the interruption task. Thus, in conventional circuit breakers, there is a risk of damage to the current interruption apparatus if a current zero does not occur within a defined time period for interrupting the current. It is therefore inherently difficult to carry out DC current interruption because, unlike AC current in which current zeros naturally occur, DC current cannot naturally reach a current zero.

EP 0 867 998 B1 discloses a solid-state DC circuit breaker comprising a stack of series-connected IGBTs in parallel with a metal-oxide surge arrester. This solution achieves a response time in the range of a few milliseconds but suffers from high steady-state power losses.

According to a first aspect of the invention, there is provided an extinguishing branch for an electrical circuit, the extinguishing branch comprising:
  a snubber circuit including an energy storage limb, wherein the energy storage limb includes first and second energy storage limb portions separated by a first junction to define a first voltage divider, and each energy storage limb portion includes at least one energy storage device; and
  an arrester limb connected across the energy storage limb, wherein the arrester limb includes first and second arrester limb portions separated by a second junction to define a second voltage divider, and each arrester limb portion includes at least one arrester element,
  wherein the first and second junctions are connected to define a voltage divider bridge, and the voltage divider bridge is electrically coupleable to the electrical circuit for providing, in use, a driving voltage to drive the electrical circuit.

It will be understood that, for the purposes of the specification, the term "connected across" is synonymous with the term "connected in parallel with". Likewise, connecting a first component "across" a second component is intended to mean that the first component is connected "in parallel with" the second component.

In embodiments of the first aspect of the invention a first voltage division ratio of the first voltage divider may be equal to a ratio of an impedance of the first energy storage limb portion to a sum of impedances of the first and second energy storage limb portions, and a second voltage division ratio of the second voltage divider may be equal to a ratio of an impedance of the first arrester limb portion to a sum of impedances of the first and second arrester limb portions.

The first voltage division ratio may be different in magnitude to the second voltage division ratio.

The impedance of the first energy storage limb portion may be larger than the impedance of the second energy storage limb portion.

Preferably the second voltage division ratio is in the range of 1:100 to 1:50. Even more preferably the second voltage division ratio is 1:70.

The snubber circuit may further include:
a passive current check element connected in series with the energy storage limb; and
a resistive element connected across the passive current check element.

According to a second aspect of the invention, there is provided a switching element comprising:
an extinguishing branch according to any embodiment of the first aspect of the invention;
a switching branch including at least one semiconductor switch switchable to selectively allow current to flow in the switching branch or commutate current from the switching branch to the extinguishing branch in order to absorb and dissipate energy; and
an auxiliary switching control unit to control the switching of the or each semiconductor switch,
wherein the voltage divider bridge is electrically coupled to the auxiliary switching control unit so as to provide, in use, a driving voltage to drive the auxiliary switching control unit.

It will be understood that current commutation refers to a process in which the flow of current is diverted from a first current path to a second current path, e.g. from the switching branch to the extinguishing branch. Such diversion of the flow of current from a first current path to a second current path may be carried out through switching of a switch in the first current path.

The switching element according to the second aspect of the invention may form part of, for example, a circuit interruption device that comprises a main branch, an auxiliary branch, and first and second terminals for connection, in use, to an electrical network, wherein the main and auxiliary branches extend between the first and second terminals. It will be appreciated that the use of the extinguishing branch to provide a power supply circuit may also be extended to electrical circuits other than a switching element forming part of a circuit interruption device.

In such a circuit interruption device, the main branch may include a switching apparatus switchable to selectively allow current to flow in the main branch in a normal mode of operation or commutate current from the main branch to the auxiliary branch in a fault mode of operation, and the auxiliary branch may include the switching element according to the second aspect of the invention.

In the normal mode of operation of the circuit interruption device, the switching apparatus is closed, and current from the electrical network flows in the main branch. Meanwhile the or each semiconductor switch of the switching element is turned off, and little to no current flows through the auxiliary branch.

In the event of a fault occurring in the electrical network resulting in high fault current flowing in the main branch, the switching apparatus is opened to commutate the fault current from the main branch to the auxiliary branch in the fault mode of operation of the circuit interruption device. Initially, after the switching apparatus is opened, the or each semiconductor switch of the auxiliary branch remains turned off, with the result that the fault current does not fully commutate from the main branch to the auxiliary branch. Instead the auxiliary branch sees a current pulse, which then charges up the energy storage devices of the energy storage limb.

Charging of the energy storage devices of the energy storage limb allows the snubber circuit to provide a driving voltage, via the voltage divider bridge, to drive the auxiliary switching control unit in order to enable control of the switching of the or each semiconductor switch. The snubber circuit therefore not only provides the switching element with a snubbing capability, but also acts as a self-powering power supply circuit that supplies power to drive the auxiliary switching control unit and thereby enable switching of the or each semiconductor switch.

Turning on the or each semiconductor switch allows current to flow in the switching branch, and thereby allows the fault current to be fully commutated from the main branch to the auxiliary branch. After a predetermined period of time, the or each semiconductor switch is turned off to commutate the fault current from the switching branch to the extinguishing branch. Shortly after the or each semiconductor switch is turned off, the voltage across the auxiliary branch becomes sufficiently high to permit current to flow through the arrester limb. This allows the arrester elements to absorb and dissipate inductive energy from the DC network so as to limit both a maximum voltage and a rate of rise of voltage across the switching element and thereby the auxiliary branch. In this manner the switching element is capable of limiting a maximum voltage and a rate of rise of voltage across the circuit interruption device during occurrence of a fault in the electrical network.

In the energy storage limb, the first energy storage limb portion is not only rated to be capable of charging up to a voltage level needed to provide the driving voltage required to drive the auxiliary switching control unit, but also rated to charge rapidly to the needed voltage level when the auxiliary branch sees the current pulse in order to achieve a desired switching response time to the occurrence of the fault in the electrical network. The ability of the first energy storage limb portion to rapidly charge to the needed voltage level obviates the need to continuously power the auxiliary switching control unit to ensure a fast switching response time of the switching element. This reduces the costs of operating the switching element and the circuit interruption device, particularly at high voltage levels.

Whilst the switching element according to the second aspect of the invention is primarily described with reference to its use in a circuit interruption device, it will be appreciated that the use of the switching element according to the second aspect of the invention may also be extended to other types of electrical circuits.

Such an electrical circuit may be one that uses one or more conventional semiconductor switches of the normally OFF type. For example, the electrical circuit may be a voltage source converter in which the semiconductor switches are switched to selectively enable transfer of power between different electrical networks.

In such an electrical circuit using one or more conventional semiconductor switches of the normally OFF type, the or each conventional semiconductor switch of the normally OFF type may be replaced by the switching element according to the second aspect of the invention. In use, a voltage appearing across the switching element in the OFF state charges up the energy storage devices of the energy storage limb. Charging of the energy storage devices of the energy storage limb allows the snubber circuit to provide a driving voltage, via the voltage divider bridge, to drive the auxiliary switching control unit in order to enable control of the switching of the or each semiconductor switch.

In a similar manner to that described above with respect to the circuit interruption device, the inclusion of the extinguishing branch in the switching element according to the second aspect of the invention provides the switching element with the capability to limit a maximum voltage and a rate of rise of voltage in the other types of electrical circuits.

The configuration of the energy storage and arrester limbs to define the first and second voltage dividers allows the switching element to be formed from a combination of a first energy storage limb portion that is rated in the above manner with an arrester limb that is rated to have a high voltage protective level. This is because the use of the first and second voltage dividers permits individual protective levels of the first and second arrester limb portions to be set so as to provide a high, overall voltage protective level of the arrester limb whilst limiting a maximum voltage that appears across the first energy storage limb portion to minimise the risk of damage. This is beneficial in that it provides increased flexibility in designing the switching element when it comes to accommodating a wide range of values of the driving voltage required to drive the auxiliary switching control unit and the voltage protective level of the arrester limb.

Meanwhile the second energy storage limb portion provides a high-frequency bypass path across the arrester limb. Omission of the second energy storage limb portion would otherwise mean that there would be no current path through the switching element until the voltage across the switching element becomes sufficiently high for the arrester limb to conduct. This would prevent the or each energy storage device of the first energy storage limb portion from charging to the needed voltage level, and thereby prevent switching of the or each semiconductor switch.

The configuration of the switching element as set out above therefore results in a switching element that can be designed to obtain a fast response time to an occurrence of a fault in an electrical network, when the switching element forms part of a circuit interruption device, and to accommodate wide voltage ranges for the driving voltage required to drive the auxiliary switching control unit and the voltage protective level of the arrester limb.

Furthermore the configuration of the switching element as set out above results in a switching element with a self-powering power supply circuit for driving the auxiliary switching control circuit to switch the or each semiconductor switch. In contrast, installing a separate power source in the switching element or supplying power from ground potential to the auxiliary switching control unit would not only increase the complexity of the structure of the switching element, but also increase the cost, size and weight of the switching element.

The structure of each limb portion is such that each of the energy storage and arrester limb portions may be further divided into two or more limb sub-portions, if desired. For example, if an energy storage limb portion includes a plurality of energy storage devices, the energy storage limb portion may be divided into two or more energy storage limb sub-portions whereby each energy storage limb sub-portion includes at least one of the plurality of energy storage devices. It will be appreciated that each of the first and second arrester limb portions may be divided in a similar manner to define two or more arrester limb sub-portions.

Moreover a junction between any two energy storage limb sub-portions may be connected to a junction between any two arrester limb sub-portions to define an additional voltage divider bridge in the extinguishing branch. For example, if the first energy storage and arrester limb portions are respectively divided into two first energy storage limb sub-portions and two first arrester limb sub-portions, a junction between the two first energy storage limb sub-portions may be connected to a junction between the two first arrester limb sub-portions to define an additional voltage divider bridge. In this manner the extinguishing branch may be configured to define one or more additional voltage divider bridges, in addition to the voltage divider bridge defined by the connection between the junction separating the first and second energy limb portions and the junction separating the first and second arrester limb portions.

A first voltage division ratio of the first voltage divider may be equal to a ratio of an impedance of the first energy storage limb portion to a sum of impedances of the first and second energy storage limb portions, and a second voltage division ratio of the second voltage divider may be equal to a ratio of an impedance of the first arrester limb portion to a sum of impedances of the first and second arrester limb portions. The first voltage division ratio may be different in magnitude to the second voltage division ratio, if desired.

Each of the first and second voltage division ratios may vary in value depending on the values of the driving voltage required to drive the auxiliary switching control unit and the voltage protective level of the arrester limb.

When the auxiliary branch sees the current pulse, the total available voltage across the switching element is significantly lower than the overall voltage protective level of the arrester limb. This results in the total available voltage across the switching element being divided between the first and second energy storage limb portions in accordance with the first voltage division ratio. As such, the first voltage division ratio may be set such that, when the auxiliary branch sees the current pulse, a larger proportion of the available voltage across the switching element appears across the first energy storage limb portion so as to enable rapid charging of the first energy storage limb portion to the needed voltage level. In other words, the impedance of the first energy storage limb portion may set to be larger than the impedance of the second energy storage limb portion. Preferably the impedances of the first and second energy storage limb portions are set so that the first voltage division ratio approaches 1:1.

After the fault has been cleared, the total available voltage across the switching element is similar in magnitude to the overall voltage protective level of the arrester limb. This results in the total available voltage across the switching element being divided between the first and second arrester limb portions in accordance with the second voltage division ratio. The second voltage division ratio may be set to limit the voltage that appears across the first arrester limb portion, and thereby the voltage that appears across the first energy storage limb portion, whilst maintaining a high, overall voltage protective level of the arrester limb. Preferably the second voltage division ratio is set to be in the range of 1:100 to 1:50. Even more preferably, the second voltage division ratio is set to be 1:70.

To ensure reliable operation of the circuit interruption device, status information of the or each semiconductor switch is required to confirm that the or each semiconductor switch is operational. However, since the or each semiconductor switch of the switching element is only turned on and only experiences voltage in response to occurrence of the fault in the electrical network, the status of the or each semiconductor switch can only be determined when the switching element of the auxiliary branch is in use.

A status check procedure may be carried out to obtain status information of the or each semiconductor switch. In the status check procedure, the switching apparatus is switched to commutate current from the main branch to the auxiliary branch. As set out earlier, this results in charging of the energy storage devices of the first and second energy storage limb portions. When the first energy storage limb portion is charged to the needed voltage level to provide the required driving voltage, the auxiliary switching control unit turns on the or each semiconductor switch to determine whether the or each semiconductor switch is operational.

In embodiments of the invention wherein the switching branch includes a plurality of semiconductor switches, the auxiliary switching control unit may control the switching of the plurality of semiconductor switches to selectively turn on the plurality of semiconductor switches either all simultaneously or one at a time.

Turning on the semiconductor switch or turning on the plurality of semiconductor switches one at a time allows detection of a failed semiconductor switch through a sudden rise in voltage of the energy storage devices of the energy storage limb.

In such embodiments, the switching element may further include at least one current sensor to measure a current flowing through each semiconductor switch.

The use of at least one current sensor permits detection of one or more failed semiconductor switches when the plurality of semiconductor switches are turned on simultaneously during the status check procedure or during operation of the circuit interruption device to clear a fault.

After status information of the or each semiconductor switch is obtained, the status information may then be provided to an external, central controller. To resume the circuit interruption device's normal mode of operation, the switching apparatus in the main branch is switched to permit current flow in the main branch, and the or each semiconductor switch in the auxiliary branch is turned off.

The configuration of the switching element therefore allows the status check procedure to be carried out quickly and periodically with negligible effect on the overall switching losses of the circuit interruption device.

The extinguishing and switching branches may be arranged in the switching element to form different configurations. For example, the extinguishing branch may be connected across the switching branch.

In further embodiments of the invention, the snubber circuit may further include:
 a passive current check element connected in series with the energy storage limb and
 a resistive element connected across the passive current check element.

The passive current check element is a device that limits current flow to only one direction, and may be in the form of, for example, a single diode or a plurality of diodes. Similarly the resistive element may include a single resistor or a plurality of resistors.

According to a third aspect of the invention, there is provided a circuit interruption device comprising:
 a main branch;
 an auxiliary branch, and
 first and second terminals for connection, in use, to an electrical network, wherein the main and auxiliary branches extend between the first and second terminals,
 wherein the main branch includes a switching apparatus switchable to selectively allow current to flow in the main branch in a first mode of operation or commutate current from the main branch to the auxiliary branch in a second mode of operation, and
 the auxiliary branch includes at least one switching element according to any embodiment of the second aspect of the invention, wherein the switching branch of the or each switching element includes at least one semiconductor switch switchable to selectively allow current to flow in that switching branch in the second mode of operation or commutate current from that switching branch to the corresponding extinguishing branch in order to absorb and dissipate energy in the second mode of operation.

In use, the circuit interruption device according to the third aspect of the invention may be used as a DC circuit breaker.

The switching apparatus may, for example, include at least one mechanical switching element and/or at least one semiconductor switching element. The number of mechanical switching elements and/or semiconductor switching elements in the switching apparatus may vary depending on the voltage and switching requirements of the circuit interruption device.

The number of switching elements in the auxiliary branch may vary depending on the voltage requirements of the circuit interruption device.

Optionally the circuit interruption device may further include a plurality of passive current check elements connected in parallel with the auxiliary branch to define a full-bridge arrangement between the first and second terminals, in order to form a bidirectional configuration of the circuit interruption device.

The circuit interruption device may further include a main switching control unit to control the switching of the switching apparatus, wherein the main and auxiliary switching control units may respectively control the switching of the switching apparatus and the or each semiconductor switch to selectively perform the aforementioned status check procedure in which the main switching control unit switches the switching apparatus to commutate current from the main branch to the auxiliary branch, followed by the or each auxiliary switching control unit turning on the or each semiconductor switch of the auxiliary branch to determine whether that semiconductor switch is operational.

In such embodiments, the auxiliary branch may include a plurality of switching elements and/or at least one switching element with a switching branch that includes a plurality of semiconductor switches, and the or each auxiliary switching control unit may control the switching of the or each corresponding semiconductor switch to selectively turn on the plurality of semiconductor switches of the auxiliary branch either all simultaneously or one at a time.

In further such embodiments, the main and auxiliary switching control units may respectively control the switching of the switching apparatus and the or each semiconductor switch to selectively repeat the status check procedure at a predetermined interval of time, in order to provide status information about the or each semiconductor switch on a regular basis.

The predetermined interval of time is preferably less than a hold-up time of the first energy storage limb portion of the corresponding first voltage divider, in order to prevent the or each energy storage device of the first energy storage limb portion from being completely depleted.

Preferred embodiments of the invention will now be described, by way of non-limiting examples, with reference to the accompanying drawings in which.

Figure 1:
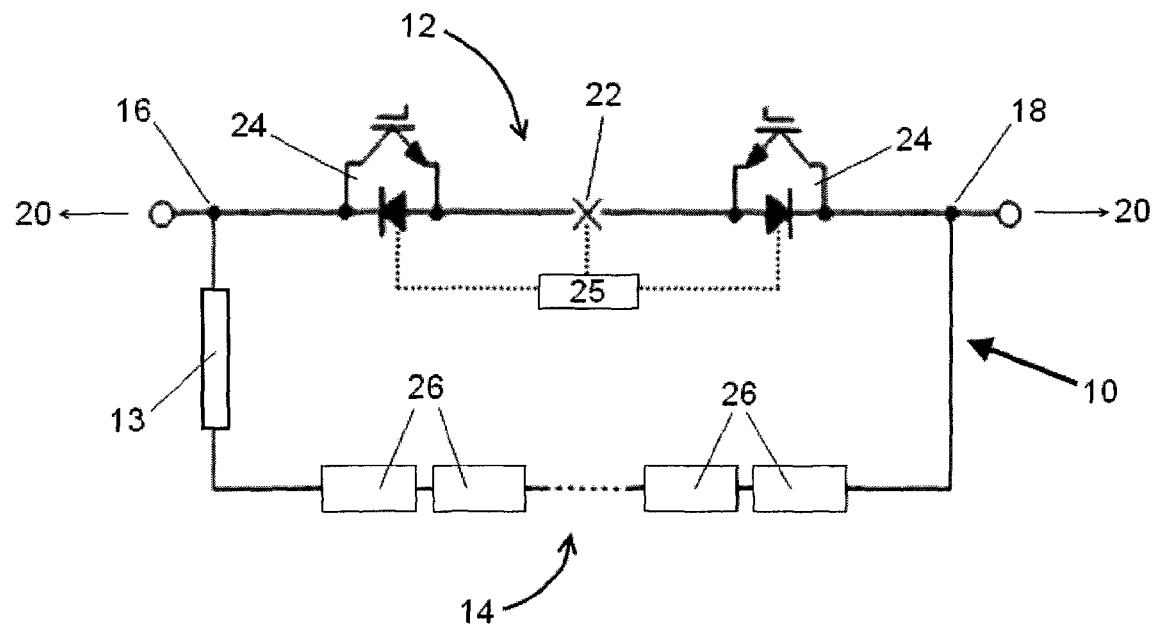
FIG. 1 shows, in schematic form, a circuit interruption device according to a first embodiment of the invention.

A first circuit interruption device 10 according to a first embodiment of the invention is shown in FIG. 1.

The first circuit interruption device 10 comprises a main branch 12, an auxiliary branch 14, and first and second terminals 16,18. Each of the main and auxiliary branches 12,14 extends between the first and second terminals 16,18.

In use, the first and second terminals 16,18 are connected to a DC electrical network 20.

The main branch 12 includes a switching apparatus in the form of a mechanical switching element 22, e.g. a vacuum interrupter switch, connected in series with a plurality of main semiconductor switches in the form of IGBTs 24. The first circuit interruption device 10 further includes a main switching control unit 25 to control the switching of the mechanical switching element 22 and the plurality of main IGBTs 24.

In other embodiments, it is envisaged that the number of mechanical switching elements 22 and main IGBTs 24 in the switching apparatus may vary depending on the voltage and switching requirements of the first circuit interruption device 10.

The auxiliary branch 14 is connected across the main branch 12, and includes a plurality of series-connected auxiliary switching elements 26. In other embodiments, it is envisaged that the number of auxiliary switching elements 26 in the auxiliary branch 14 may vary depending on the voltage requirements of the auxiliary branch 14.

A stray inductance 13 is present in the first circuit interruption device 10. The stray inductance 13 is illustrated in FIG. 1 as being connected in series with the auxiliary branch 14 between the first and second terminals 16,18.

Figure 2:
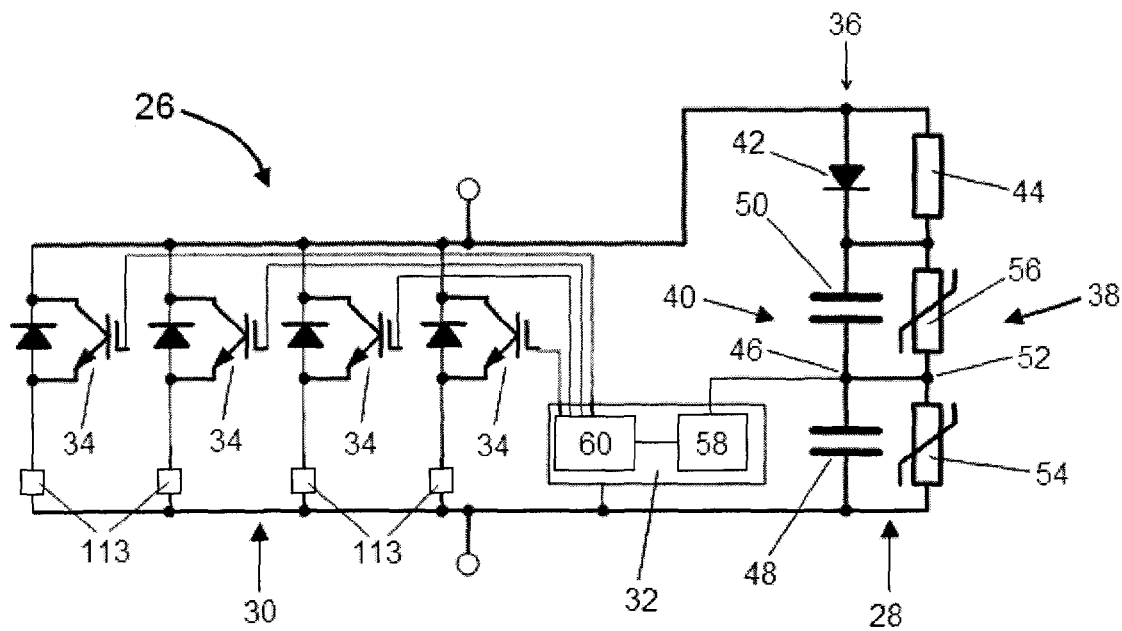
FIG. 2 shows, in schematic form, a switching element forming part of the circuit interruption device of FIG. 1.

FIG. 2 shows, in schematic form, the structure of each auxiliary switching element 26.

Each auxiliary switching element 26 includes an extinguishing branch 28, a switching branch 30 and an auxiliary switching control unit 32. The switching branch 30 includes a plurality of parallel-connected auxiliary semiconductor switches in the form of IGBTs 34. In other embodiments of the invention, one or more of the auxiliary semiconductor switches may take the form of a gate turn-off thyristor (GTO), a gate-commutated thyristor (GCT), an integrated gate-commutated thyristor (IGCT), a metal oxide semiconductor field-effect transistor (MOSFET) or a junction field-effect transistor (JFET).

It is envisaged that, in further embodiments, the number of parallel-connected auxiliary IGBTs 34 in the switching branch 30 may vary depending on the current requirements of the auxiliary switching element 26. It is also envisaged that, in still further embodiments, the plurality of parallel-connected auxiliary IGBTs 34 may be replaced by a single auxiliary IGBT.

The extinguishing branch 28 is connected across the switching branch 30, and includes a snubber circuit 36 and an arrester limb 38.

The snubber circuit 36 includes an energy storage limb 40 connected in series with a passive current check element in the form of a diode 42, and a resistor 44 connected across the passive current check element.

It is envisaged that, in other embodiments, the diode 42 may be replaced by another type of passive current check element that limits current flow to only one direction. It is also envisaged that, in other embodiments, the diode 42 may be replaced by a plurality of diodes and/or the resistor 44 may be replaced by a plurality of resistors.

The energy storage limb 40 defines first and second energy storage limb portions separated by a first junction 46 to define a first voltage divider. The first energy storage limb portion includes a first capacitor 48, and the second energy storage limb portion includes a second capacitor 50.

A first voltage division ratio of the first voltage divider is equal to a ratio of an impedance of the first energy storage limb portion to a sum of impedances of the first and second energy storage limb portions. In the embodiment shown in FIG. 2, the first voltage division ratio is equal to a ratio of an impedance of the first capacitor 48 to a sum of impedances of the first and second capacitors 50.

The arrester limb 38 is connected across the energy storage limb 40, and defines first and second arrester limb portions separated by a second junction 52 to define a second voltage divider. The first arrester limb portion includes a first arrester element 54, and the second arrester limb portion includes a second arrester element 56.

A second voltage division ratio of the second voltage divider is equal to a ratio of an impedance of the first arrester limb portion to a sum of impedances of the first and second arrester limb portions. In the embodiment shown in FIG. 2, the second voltage division ratio is equal to a ratio of a voltage protective level of the first arrester element 54 to a sum of voltage protective levels of the first and second arrester elements 54,56.

It is envisaged that, in other embodiments of the invention, each of the first and second energy storage limb portions may include more than one capacitor, and/or each of the first and second arrester limb portions may include more than one arrester element.

The auxiliary switching control unit 32 includes a power supply unit 58 and control electronics 60 to control the switching of each auxiliary IGBT 34. The first and second junctions 46,52 are connected to define a voltage divider bridge, which is electrically coupled to the power supply unit 58 of the auxiliary switching control unit 32. The first capacitor 48 is rated to be capable of charging up to a voltage level needed to provide the driving voltage that is required to drive the auxiliary switching control unit 32, i.e. power the power supply unit 58 to enable the control electronics 60 to control the switching of each auxiliary IGBT 34.

Operation of the first circuit interruption device 10 in FIG. 1 to interrupt current in the DC network 20 is described as follows, with reference to FIGS. 1 to 5.

Figure 3:
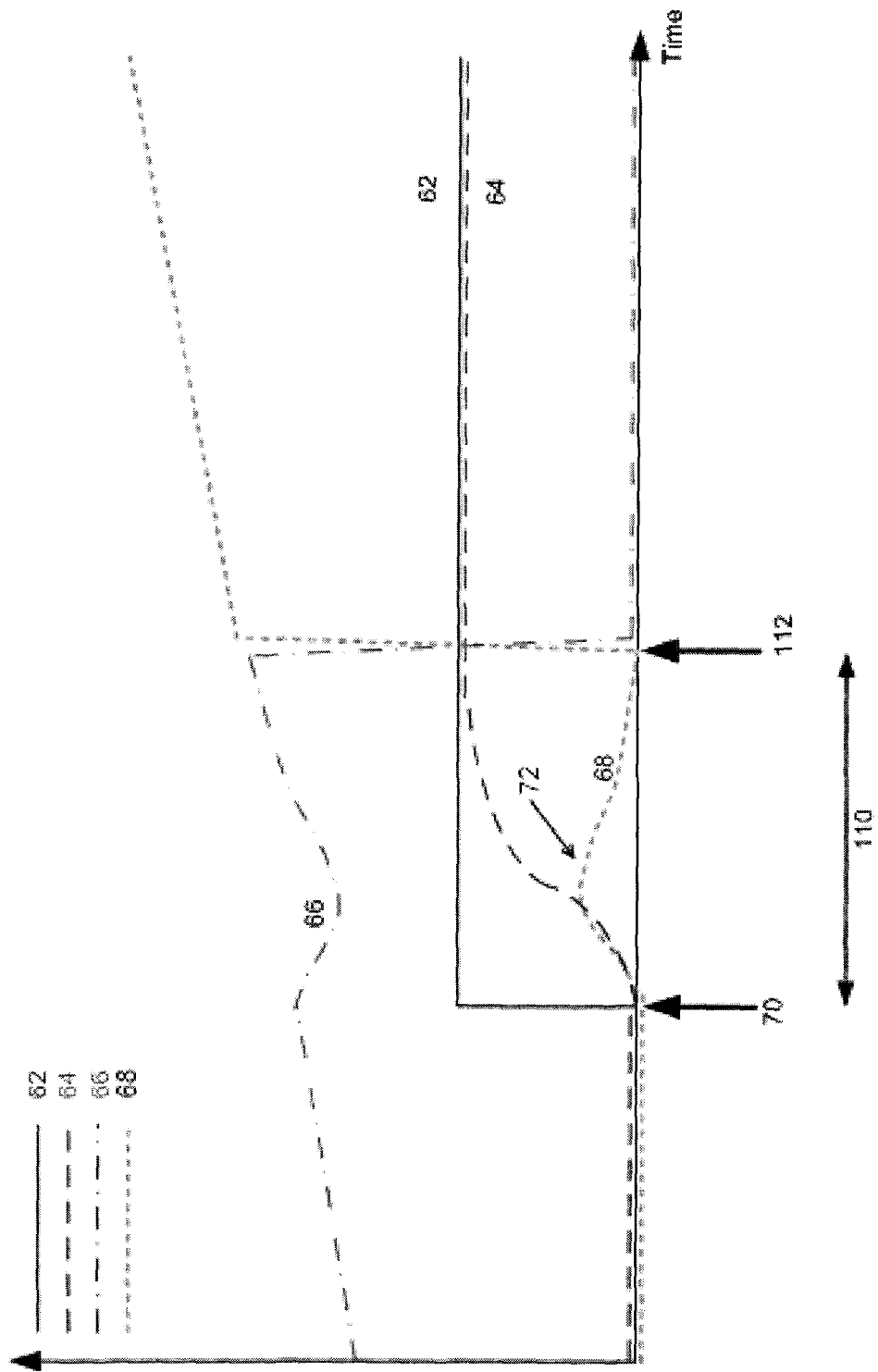
FIG. 3 illustrates the changes in voltage across the main and auxiliary branches, and the changes in current in the main and auxiliary branches.

FIG. 3 illustrates the changes in voltage 62,64 across the main and auxiliary branches 12,14, and the changes in current 66,68 in the main and auxiliary branches 12,14.

During normal operation of the DC network 20, the switching apparatus is closed and current 66 from the electrical network 20 flows in the main branch 12 in a normal mode of operation of the first circuit interruption device 10. Meanwhile each auxiliary IGBT 34 of each auxiliary switching element 26 is turned off, and little to no current 68 flows through the auxiliary branch 14.

A fault or other abnormal operating condition in the DC network 20 may lead to high fault current flowing through the DC network 20.

In response to an event of high fault current in the DC network 20, the main switching control unit 25 controls the switching of the switching apparatus to open 70 in order to commutate current from the main branch 12 to the auxiliary branch 14 in a fault mode of operation of the first circuit interruption device 10. Initially, after the switching apparatus is opened, the auxiliary IGBTs 34 remain turned off, with the result that the fault current does not fully commutate from the main branch 12 to the auxiliary branch 14. Instead the auxiliary branch 14 sees a current pulse 72, which then charges the first and second capacitors 48,50.

When the auxiliary branch 14 sees the current pulse 72, the total available voltage across each auxiliary switching element 26 is significantly lower than the total voltage protective level of the corresponding arrester limb 38. This results in the total available voltage being divided in accordance with the first voltage division ratio.

The first voltage division ratio is preferably set to ensure that, when the auxiliary branch 14 sees the current pulse 72, a larger proportion of the available voltage across each auxiliary switching element 26 appears across the first capacitor 48 to enable rapid charging of the first capacitor 48. This requires the capacitance of the second capacitor 50 to be larger than the capacitance of the first capacitor 48. The first voltage division ratio preferably approaches 1:1.

Figure 4:
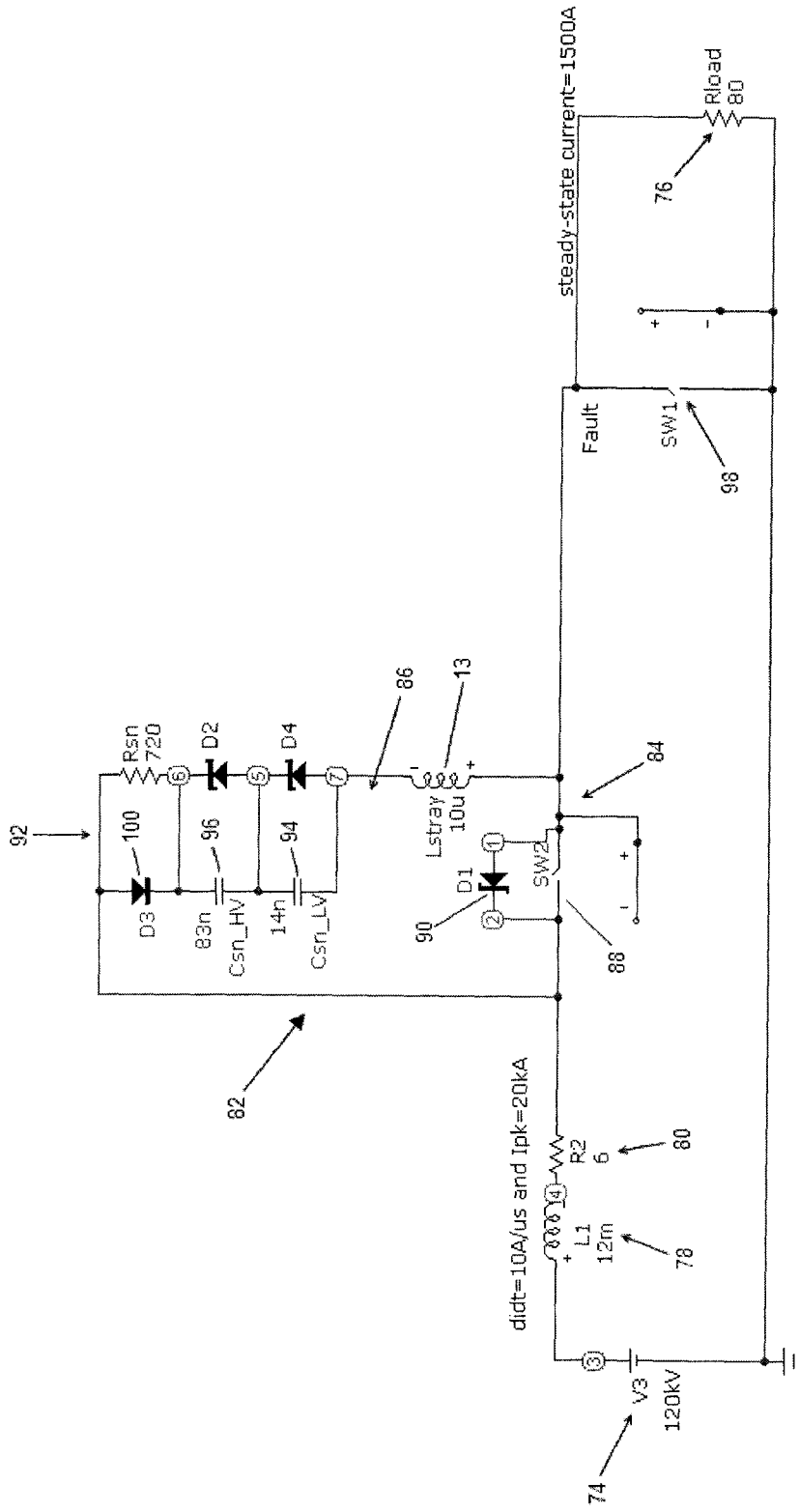
FIG. 4 shows, in schematic form, a model to simulate an initial charging step of first and second capacitors of a switching element in response to an occurrence of a fault in an electrical network.
Figure 5:
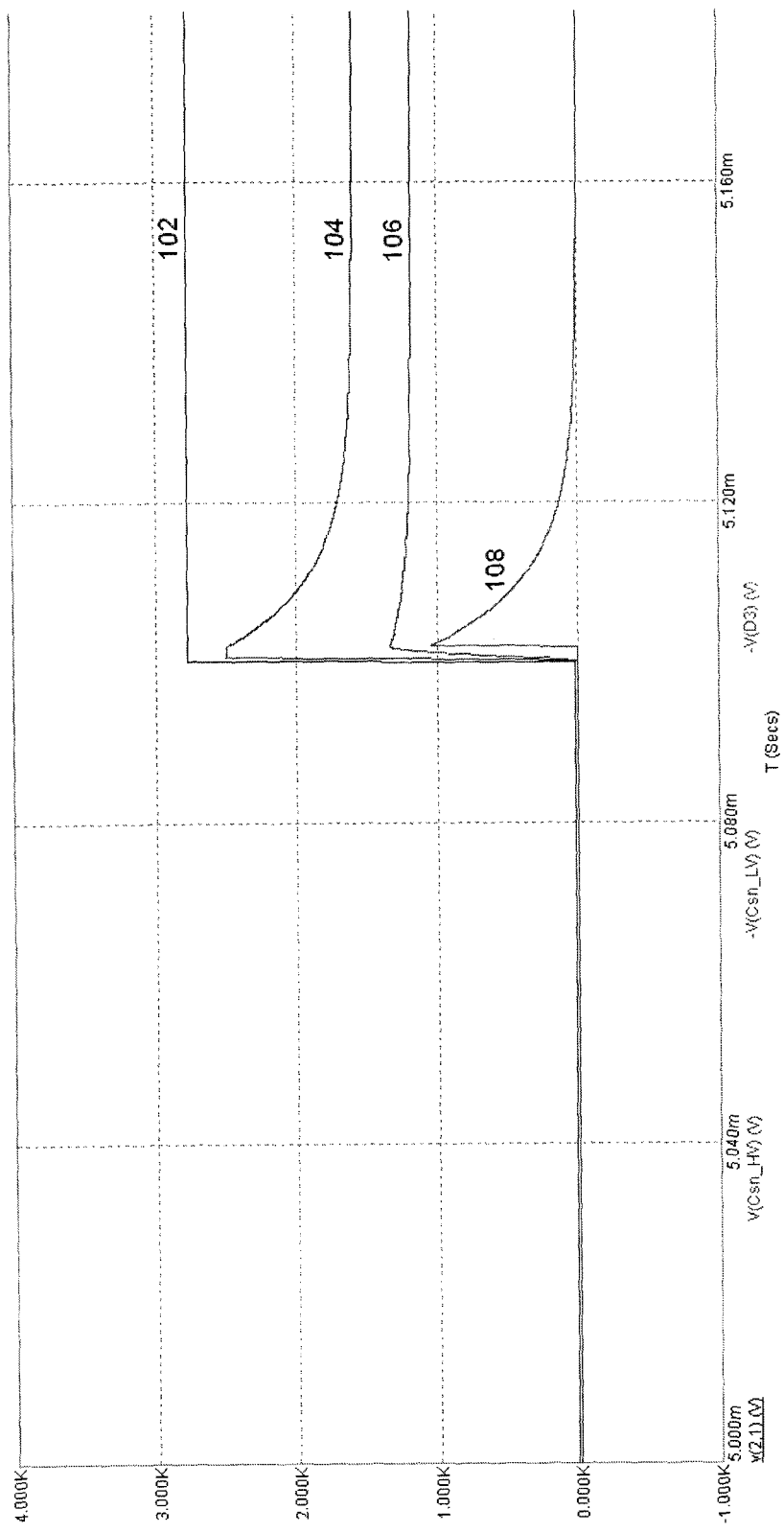
FIG. 5 illustrates simulation results for the model of FIG. 4.

FIG. 4 shows, in schematic form, a model to simulate an initial charging step of first and second capacitors 94,96 of an auxiliary switching element in response to an occurrence of a fault in a DC electrical network, and FIG. 5 illustrates simulation results for the model of FIG. 4.

In the model, the DC electrical network comprises a 120 kV voltage supply 74 that is connected to a load 76 of 80Ω. The inductance 78 and resistance 80 of the voltage supply 74 is chosen to provide a peak fault current of 20 kA and a rate of change in current with time of 10 A per µs.

A circuit interruption device 82 is connected in series between the voltage supply 74 and the load 76. The circuit interruption device 82 comprises a main branch 84 and an auxiliary branch 86. The main branch 84 comprises a 3.3 kV main IGBT 88 connected in parallel with a 2.5 kV surge arrester 90. The arrester 90 is represented in FIG. 4 as Zener diode D1. The auxiliary branch 86 comprises an auxiliary switching element with an extinguishing branch 92, which is similar in structure to the extinguishing branch 28 of the first circuit interruption device 10 of FIG. 1, and a stray inductance 13. The first and second arrester limb portions of the extinguishing branch 92 are respectively represented in FIG. 4 as Zener diodes D2 and D4.

For the purposes of the simulation, the model omits the switching branch of the auxiliary switching element, since it is not involved in the initial charging step of the first and second capacitors 94,96 of the auxiliary switching element.

The model further includes a switch 98 across the load 76 that can be closed to simulate an occurrence of a fault in the DC network.

In the absence of a fault in the DC network, the voltages 102,104,106,108 across the main branch, the first capacitor 94, the second capacitor 98 and the diode 100 of the snubber circuit are zero, as shown in FIG. 5.

When the fault occurs in the DC electrical network, the main IGBT 88 is turned off. This results in rapid increases in the voltage 102 across the main branch 84, the voltage 104 across the first capacitor 94 and the voltage 106 across the second capacitor 96, as shown in FIG. 5. FIG. 5 also shows that the voltage 108 across the diode 100 of the snubber circuit temporarily increases before returning to zero.

It is therefore shown from the model of FIG. 4 and the simulation results of FIG. 5 that the configuration of the auxiliary switching element according to the invention results in rapid charging of the first capacitor 94 in response to the main IGBT 88 of the main branch 84 being turned off.

Reverting to FIG. 1, the ability of each first capacitor 48 to rapidly charge to the needed voltage level obviates the need to continuously power each auxiliary switching control unit 32 to ensure a fast switching response time of each auxiliary switching element 26. This reduces the costs of operating each auxiliary switching element 26 and the first circuit interruption device 10, particularly at high voltage levels.

The second capacitor 50 provides a high-frequency bypass path across the arrester limb 38. Omission of the second capacitor 50 would otherwise mean that there would be no current path through the auxiliary switching element 26 until the voltage across the auxiliary switching element 26 becomes sufficiently high for the arrester limb 38 to conduct. This would prevent the first capacitor 48 from charging to the needed voltage level to provide the required driving voltage, and thereby prevent switching of each auxiliary IGBT 34.

After the first capacitor 48 has had sufficient time 110 to charge up to the voltage level needed to provide the required driving voltage, the snubber circuit 36 provides the driving voltage, via the voltage divider bridge, to the power supply unit 58 of the auxiliary switching control unit 32. The snubber circuit 36 therefore not only provides the auxiliary switching element 26 with a snubbing capability, but also acts as a self-powering power supply circuit that supplies power to drive the auxiliary switching control unit 32 and thereby enable switching of the auxiliary IGBTs 34. Each auxiliary IGBT 34 is then turned on 112 to allow current 68 to flow in each switching branch 30, and thereby allow the fault current to be fully commutated from the main branch 12 to the auxiliary branch 14.

After a predetermined period of time, typically at least hundreds of µs, each auxiliary switching control unit 32 controls the switching of the corresponding auxiliary IGBTs 34 to turn off to commutate the fault current from the switching branch 30 to the extinguishing branch 28. Meanwhile, in each auxiliary switching element 26, the first capacitor 48 will have enough available stored energy to allow the snubber circuit 36 to provide the driving voltage to the power supply unit 58 of the auxiliary switching control unit 32 to turn off the auxiliary IGBTs 34.

Shortly after the auxiliary IGBTs 34 are turned off, the voltage across the auxiliary branch 14 becomes sufficiently high to permit current to flow through each arrester limb 38. This allows the arrester elements 54,56 to absorb and dissipate inductive energy from the DC network 20 so as to limit both a maximum voltage and a rate of rise of voltage across each auxiliary switching element 26 and thereby limit both a maximum voltage and a rate of rise of voltage across the first circuit interruption device 10. At this stage the total available voltage across each auxiliary switching element 26 is similar in magnitude to the overall voltage protective level of the corresponding arrester limb 38. This results in the total available voltage across each auxiliary switching element 26 being divided between the corresponding first and second arrester elements 54,56 in accordance with the second voltage division ratio.

The second voltage division ratio is preferably set to limit the voltage that appears across the first arrester element 54, and thereby the voltage that appears across the first capacitor 48, whilst maintaining a high, overall voltage protective level of the arrester limb 38. More particularly, the second voltage division ratio may be in the range of 1:100 to 1:50, and even more particularly, the second voltage division ratio may be 1:70.

The configuration of the energy storage and arrester limbs 40,38 in each auxiliary switching element 26 to define the first and second voltage dividers allows each auxiliary switching element 26 to be formed from a combination of a first capacitor 48 that is rated to rapidly charge to the needed voltage level with an arrester limb 38 that is rated to have a high voltage protective level. This is because the use of the first and second voltage dividers permits individual protective levels of the first and second arrester elements 54,56 to be set so as to provide a high, overall voltage protective level of the arrester limb 38 whilst limiting a maximum voltage that appears across the first capacitor 48 to minimise the risk of damage. This is beneficial in that it provides increased flexibility in designing each auxiliary switching element 26 when it comes to accommodating a wide range of values of the driving voltage required to drive each auxiliary switching control unit 32 and the voltage protective level of each arrester limb 38.

The configuration of each auxiliary switching element 26 as set out above therefore results in an auxiliary switching element 26 that can be designed to obtain a fast response time to an occurrence of a fault in the DC electrical network 20 and to accommodate wide voltage ranges for the driving voltage required to drive the auxiliary switching control unit 32 and the voltage protective level of the arrester limb 38.

Furthermore the configuration of each auxiliary switching element 26 as set out above results in an auxiliary switching element 26 with a self-powering power supply circuit for driving the auxiliary switching control circuit to switch each auxiliary IGBT 34. In contrast, installing a separate power source in each auxiliary switching element 26 or supplying power from ground potential to each auxiliary switching control unit 32 would not only increase the complexity of the structure of each auxiliary switching element 26, but also increase the cost, size and weight of each auxiliary switching element 26.

The use of the plurality of auxiliary switching elements 26 in the auxiliary branch 14 therefore results in a smaller, lighter and more cost-efficient circuit interruption device.

To ensure reliable operation of the first circuit interruption device 10, status information of each auxiliary IGBT 34 is required to confirm that each auxiliary IGBT 34 is operational. However, since each auxiliary IGBT 34 only experiences voltage and is only turned on in response to occurrence of the fault in the DC electrical network 20, the status of each auxiliary IGBT 34 can only be determined when each auxiliary switching element 26 of the auxiliary branch 14 is in use.

A status check procedure may be carried out to obtain status information of each auxiliary IGBT 34. In the status check procedure, the main switching control unit 25 controls the switching of the main IGBTs 24 to turn off to commutate current from the main branch 12 to the auxiliary branch 14. Preferably the mechanical switching element 22 is kept closed, during the status check procedure.

As set out earlier, this results in a current pulse 72 in the auxiliary branch 14 that charges the first and second capacitors 48,50 of each auxiliary switching element 26. When each first capacitor 48 is charged to the needed voltage level to provide the required driving voltage, each auxiliary switching control unit 32 turns on each auxiliary IGBT 34 to determine whether each auxiliary IGBT 34 is operational.

The auxiliary switching control units 32 may control the switching of the auxiliary IGBTs 34 of the auxiliary branch 14 to selectively turn on the plurality of auxiliary IGBTs 34 either all simultaneously or one at a time.

Turning on the auxiliary IGBTs 34 one at a time allows detection of a failed auxiliary IGBT 34 through a sudden rise in voltage of the first and second capacitors 48,50 of the corresponding energy storage limb 40.

Each auxiliary switching element 26 further includes a plurality of current sensors 113 to measure a current flowing through each of its plurality of auxiliary IGBTs 34. The use of the current sensors 113 permits detection of one or more failed auxiliary IGBTs 34 when the auxiliary IGBTs 34 are turned on simultaneously during the status check procedure or during the operation of the first circuit interruption device 10 to clear a fault.

In other embodiments of the invention, each auxiliary switching element 26 may omit the plurality of current sensors 113.

After status information of each auxiliary IGBT 34 is obtained, the status information may then be provided to an external, central controller (not shown). To resume the first circuit interruption device's normal mode of operation, the main switching control unit 25 controls the switching of the main IGBTs 24 to turn on to permit current flow in the main branch 12, and the auxiliary switching control unit 32 controls the switching of the auxiliary IGBTs 34 in the auxiliary branch 14 to turn off.

The configuration of the auxiliary switching elements 26 in the first circuit interruption device 10 therefore allows the status check procedure to be carried out quickly and periodically with negligible effect on the overall switching losses of the first circuit interruption device 10.

The status check procedure may be repeated at a predetermined interval of time, in order to provide status information about each auxiliary IGBT on a regular basis. Preferably the predetermined interval of time is set to be less than a hold-up time of the first capacitor 48 of each auxiliary switching element 26, in order to prevent each first capacitor 48 from being completely depleted.

Figure 6:
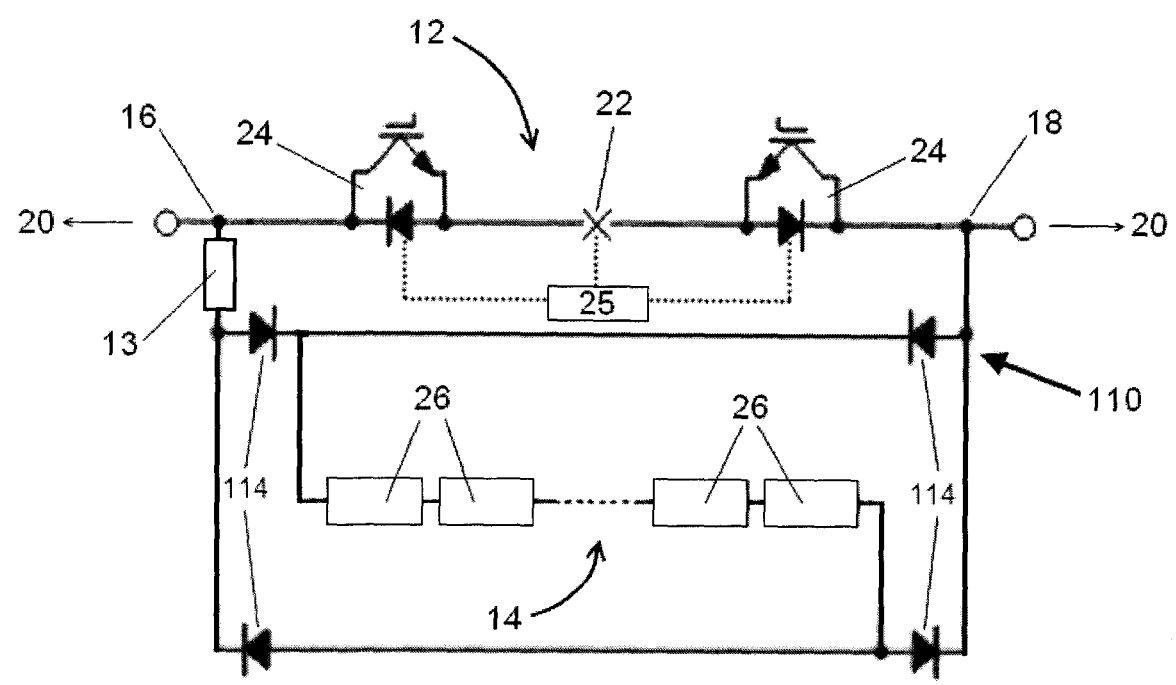
FIG. 6 shows, in schematic form, a circuit interruption device according to a second embodiment of the invention.

A second circuit interruption device 110 according to a second embodiment of the invention is shown in FIG. 6. The second circuit interruption device 110 of FIG. 6 is similar in structure and operation to the first circuit interruption device 10 of FIG. 1, and like features share the same reference numerals.

The second circuit interruption device 110 differs from the first circuit interruption device 10 in that the second circuit interruption device 110 further includes a plurality of passive current check elements 114 connected in parallel with the auxiliary branch 14 to define a full-bridge arrangement between the first and second terminals 16,18.

The configuration of the second circuit interruption device 110 in this manner results in a circuit interruption device 110 with bidirectional current interruption capabilities, i.e. it is capable to operate in both directions of current between the first and second terminals 16,18 of the circuit interruption device.

The stray inductance 13 in the second circuit interruption device 110 is illustrated in FIG. 6 as being connected in series with the full-bridge arrangement between the first and second terminals 16,18.

In other embodiments, it is envisaged that the number of passive current check elements 114 connected in parallel with the auxiliary branch 14 to define a full-bridge arrangement between the first and second terminals 16,18 may vary depending on the voltage requirements of the first circuit interruption device 10.

Whilst the auxiliary switching element 26 is primarily described with reference to its use in a circuit interruption device 10,110, it will be appreciated that the use of the auxiliary switching element 26 may also be extended to other types of electrical circuits, examples of which are described earlier in this specification.

The invention claimed is:

1. An extinguishing branch for an electrical circuit, the extinguishing branch comprising:
   a snubber circuit including an energy storage limb, wherein the energy storage limb includes first and second energy storage limb portions separated by a first junction to define a first voltage divider, and each energy storage limb portion includes at least one energy storage device; and
   an arrester limb connected across the energy storage limb, wherein the arrester limb includes first and second arrester limb portions separated by a second junction to define a second voltage divider, and each arrester limb portion includes at least one arrester element,
   wherein the first and second junctions are connected to define a voltage divider bridge, and the voltage divider bridge is electrically coupleable to the electrical circuit for providing, in use, a driving voltage to drive the electrical circuit,
   wherein a first voltage division ratio of the first voltage divider is equal to a ratio of an impedance of the first energy storage limb portion to a sum of impedances of the first and second energy storage limb portions, and a second voltage division ratio of the second voltage divider is equal to a ratio of an impedance of the first arrester limb portion to a sum of impedances of the first and second arrester limb portions, and
   wherein the first voltage division ratio is different in magnitude to the second voltage division ratio and/or wherein the impedance of the first energy storage limb portion is larger than the impedance of the second energy storage limb portion.

2. An extinguishing branch according to claim 1 wherein the second voltage division ratio is in the range of 1:100 to 1:50.

3. An extinguishing branch according to claim 2 wherein the second voltage division ratio is 1:70.

4. An extinguishing branch according to claim 1 wherein the snubber circuit further includes:
   a passive current check element connected in series with the energy storage limb; and
   a resistive element connected across the passive current check element.

5. A switching element comprising:
   an extinguishing branch according to any preceding claim;
   a switching branch including at least one semiconductor switch switchable to selectively allow current to flow in the switching branch or commutate current from the switching branch to the extinguishing branch in order to absorb and dissipate energy; and
   an auxiliary switching control unit to control the switching of the or each semiconductor switch,
   wherein the voltage divider bridge is electrically coupled to the auxiliary switching control unit so as to provide, in use, a driving voltage to drive the auxiliary switching control unit.

6. A switching element according to claim 5 wherein the switching branch includes a plurality of semiconductor switches, and the auxiliary switching control unit controls the switching of the plurality of semiconductor switches to selectively turn on the plurality of semiconductor switches either all simultaneously or one at a time.

7. A switching element according to claim 6 further including at least one current sensor to measure a current flowing through each semiconductor switch.

8. A circuit interruption device comprising:
   a main branch;
   an auxiliary branch; and
   first and second terminals for connection, in use, to an electrical network, wherein the main and auxiliary branches extend between the first and second terminals,
   wherein the main branch includes a switching apparatus switchable to selectively allow current to flow in the main branch in a first mode of operation or commutate current from the main branch to the auxiliary branch in a second mode of operation, and
   the auxiliary branch includes at least one switching element according to claim 5, wherein the switching branch of the or each switching element includes at least one semiconductor switch switchable to selectively allow current to flow in that switching branch in the second mode of operation or commutate current from that switching branch to the corresponding extinguishing branch in order to absorb and dissipate energy in the second mode of operation.

9. A circuit interruption device according to claim 8 further including a plurality of passive current check elements connected in parallel with the auxiliary branch to define a full-bridge arrangement between the first and second terminals.

10. A circuit interruption device according to claim 8 or further including a main switching control unit to control the switching of the switching apparatus, wherein the main and auxiliary switching control units respectively control the switching of the switching apparatus and the or each semiconductor switch to selectively perform a status check procedure in which the main switching control unit switches the switching apparatus to commutate current from the main branch to the auxiliary branch, followed by the or each auxiliary switching control unit turning on the or each semiconductor switch of the auxiliary branch to determine whether that semiconductor switch is operational.

11. A circuit interruption device according to claim 10 wherein the auxiliary branch includes a plurality of switching elements and/or at least one switching element with a switching branch that includes a plurality of semiconductor switches, and the or each auxiliary switching control unit controls the switching of the or each corresponding semiconductor switch to selectively turn on the plurality of semiconductor switches of the auxiliary branch either all simultaneously or one at a time.

12. A circuit interruption device according to claim 10 or wherein the main and auxiliary switching control units respectively control the switching of the switching apparatus and the or each semiconductor switch to selectively repeat the status check procedure at a predetermined interval of time.

13. A circuit interruption device according to claim 12 wherein the predetermined interval of time is less than a hold-up time of the first energy storage limb portion of the corresponding first voltage divider.

* * * * *